United States Patent
Shin et al.

(10) Patent No.: US 10,218,930 B2
(45) Date of Patent: Feb. 26, 2019

(54) COUNTING CIRCUIT INCLUDING A PLURALITY OF LATCH CIRCUITS AND IMAGE SENSING DEVICE WITH THE COUNTING CIRCUIT

(71) Applicant: SK hynix Inc., Gyeonggi-do (KR)

(72) Inventors: Min-Seok Shin, Gyeonggi-do (KR); Jung-Eun Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 372 days.

(21) Appl. No.: 14/924,418

(22) Filed: Oct. 27, 2015

(65) Prior Publication Data
US 2016/0366358 A1  Dec. 15, 2016

(30) Foreign Application Priority Data

Jun. 9, 2015 (KR) .................. 10-2015-0081056

(51) Int. Cl.
*H03K 21/02* (2006.01)
*H04N 5/376* (2011.01)
*H04N 5/378* (2011.01)

(52) U.S. Cl.
CPC ........... *H04N 5/378* (2013.01); *H03K 21/026* (2013.01); *H04N 5/3765* (2013.01)

(58) Field of Classification Search
CPC ..... H04N 5/378; H04N 5/3765; H03K 21/026
See application file for complete search history.

(56) References Cited

U.S. PATENT DOCUMENTS

| | | | | |
|---|---|---|---|---|
| 9,774,332 B2* | 9/2017 | Lee | ...................... | H03K 21/026 |
| 2003/0214335 A1* | 11/2003 | Saeki | ..................... | H03K 5/133 |
| | | | | 327/165 |
| 2007/0080838 A1* | 4/2007 | Asayama | ............ | H03M 1/0863 |
| | | | | 341/144 |
| 2008/0043128 A1* | 2/2008 | Poonnen | ............... | H03M 1/123 |
| | | | | 348/294 |
| 2008/0303931 A1* | 12/2008 | Taguchi | ................. | H04N 5/335 |
| | | | | 348/308 |
| 2010/0207798 A1* | 8/2010 | Lim | ..................... | H03K 21/023 |
| | | | | 341/155 |
| 2011/0242385 A1 | 10/2011 | Nishihara | | |
| 2014/0313385 A1* | 10/2014 | Sato | ....................... | H04N 5/378 |
| | | | | 348/302 |

FOREIGN PATENT DOCUMENTS

KR  1020110025376  3/2011

* cited by examiner

*Primary Examiner* — Que Tan Le
*Assistant Examiner* — Jennifer D Bennett
(74) *Attorney, Agent, or Firm* — IP & T Group LLP

(57) ABSTRACT

A read-out method of an image sensing device includes: firstly counting a reset signal of a pixel signal based on a first analog gain during a first period of a unit row period; storing a result of the first counting as a previous counting result; secondly counting the reset signal based on a second analog gain; thirdly counting a data signal of the pixel signal based on the second analog gain during a second period following the first period in the unit row period; storing a first counting signal corresponding to results of the second counting and the third counting; fourthly counting the data signal based on the first analog gain during a third period following the second period in the unit row period; and storing a second counting signal corresponding to the previous counting result and a result of the fourth counting.

15 Claims, 7 Drawing Sheets

COUNTING CIRCUIT INCLUDING A PLURALITY OF LATCH CIRCUITS AND IMAGE SENSING DEVICE WITH THE COUNTING CIRCUIT

CROSS-REFERENCE TO RELATED APPLICATIONS

The present application claims priority of Korean Patent Application No. 10-2015-0081056, filed on Jun. 9, 2015, which is incorporated herein by reference in its entirety.

BACKGROUND

1. Field

Exemplary embodiments of the present invention relate to a semiconductor design technology, and more particularly, to a counting circuit, an image sensing device with the counting circuit and a read-out method of the image sensing device.

2. Description of the Related Art

Image sensing devices capture images using the photosensitive properties of semiconductors. Image sensing devices may be classified into charge coupled device (CCD) image sensors and complementary metal oxide semiconductor (CMOS) image sensors. The CMOS image sensors have come into widespread use. This is because CMOS image sensors allow analog circuits and digital control circuits to be realized on a single integrated circuit (IC).

The image sensing device employs high dynamic range (HDR) technology to provide a clear image. The HDR technology generally adopts a frame multiple capture method. According to the frame multiple capture method, images are synthesized by capturing successive frames at different exposure times. However, the frame multiple capture method requires a frame memory, and thus it is difficult to use the frame multiple capture method in the mobile field using limited resources. Thus, there has been proposed HDR technology which reflects different exposure times on a 2-row basis. In the HDR technology, however, motion artifact may occur when images are synthesized. In order to improve such a problem, the solid-state imaging device and camera system of U.S. Pat. No. 8,643,755 ("Nishihara") has been proposed. Nishihara uses different analog gains for the same pixel and thus obtains results into which different exposure times are reflected. The device of Nishihara performs a read-out operation through Correlated Double Sampling (CDS) during first analog to digital (A/D) conversion for a small ramping slope, and performs a read-out operation through delta-reset sampling (DRS) during second A/D conversion for a great ramping slope. Nishihara can remove KT/C noise through CDS during the first A/D conversion, but cannot remove KT/C noise through DRS during the second A/D conversion.

Since the KT/C noise relies on the switch-off characteristic of a transistor, to which a reset signal RX is inputted, among transistors included in the pixel, the KT/C noise randomly occurs whenever the transistor is switched off.

Furthermore, Nishihara may generate only two image data corresponding to two analog gains. In other words, Nishihara cannot generate three or more image data corresponding to three or more analog gains.

SUMMARY

Various embodiments are directed to a counting circuit capable of performing two or more read-out operations for the same pixel during a unit row period, and performing the two or more read-out operation through correlated double sampling (CDS), an image sensing device having the counting circuit and a read-out method of the image sensing device.

In an embodiment, A counting circuit may include: a sampling unit suitable for sampling an inverted bit signal, which corresponds to any one of inverted signals of a bit signal and a previous bit signal, as the bit signal in response to a counting target clock signal; a first latch unit suitable for latching the bit signal, as which the sampling unit samples the inverted bit signal corresponding to the inverted signal of the bit signal during a first period, as the previous bit signal at a first time point in response to a first latch control signal, and suitable for providing the previous bit signal to the sampling unit at a third time point in response to a load control signal; a second latch unit suitable for latching the bit signal, as which the sampling unit samples the inverted bit signal corresponding to the inverted signal of the bit signal during a second period, as a first counting bit signal at a second time point in response to a second latch control signal; and a third latch unit suitable for latching the bit signal, as which the sampling unit samples the inverted bit signal corresponding to the inverted signal of the previous bit signal during a third period, as a second counting bit signal at a fourth time point in response to a third latch control signal.

The counting circuit may further include: a selection unit suitable for selecting any one of the bit signal and the previous bit signal as a selected bit signal in response to the load control signal; and an inversion unit suitable for generating the inverted bit signal by inverting the selected bit signal.

The counting circuit may further include an offset cancellation unit suitable for performing a digital double sampling (DDS) operation on the bit signal.

The DDS operation may include any one of single-direction counting, up/down counting, and Bit-Wise Inversion (BWI).

The sampling unit may sample the inverted bit signal as the bit signal in response to the counting target clock signal, into which a second reset signal and a second data signal are sequentially reflected during the second period. The offset cancellation unit may perform the DDS operation on the bit signal during the second period. The second latch unit may latch the bit signal, on which the DDS operation is performed, as the first counting bit signal.

The sampling unit may sample the inverted bit signal as the bit signal in response to the counting target clock signal, into which a first reset signal is reflected during the first period. The sampling unit may sample the inverted bit signal as the bit signal, on which the DDS operation has been performed regardless of the offset cancellation unit, in response to the counting target clock signal, into which a first data signal is reflected during the third period. The third latch unit may latch the bit signal, on which the DDS operation is performed, as the second counting bit signal.

In an embodiment, an image sensing device may include: a pixel block suitable for generating a pixel signal corresponding to a reset signal during a reset period of a unit row period, and generating the pixel signal corresponding to a data signal during a data period of the unit row period; a ramp signal generation block suitable for generating a ramp signal which ramps a plurality of times with different slopes during the reset period and ramps a plurality of times with different slopes during the data period; a comparison block suitable for generating a comparison signal which includes a first comparison result obtained by comparing the ramp signal and the reset signal a plurality of times during the reset signal, and a second comparison result obtained by comparing the ramp signal and the data signal a plurality of times during the data period; and a counting block suitable for generating a plurality of counting signals corresponding to the first and second comparison results in response to a counting clock signal, a plurality of latch control signals, one or more load control signals, and the comparison signal during the unit row period.

The counting block may generate the plurality of counting signals through correlated double sampling (CDS).

The counting block may include: a counting control unit suitable for generating a counting target clock signal in response to the counting clock signal and the comparison signal; a sampling unit suitable for sampling an inverted bit signal, which corresponds to any one of inverted signals of a bit signal and a previous bit signal, as the bit signal in response to the counting target clock signal; a first latch unit suitable for latching the bit signal, as which the sampling unit samples the inverted bit signal corresponding to the inverted signal of the bit signal during a first period, as the previous bit signal at a first time point in response to a first latch control signal of the plurality of latch control signals, and suitable for providing the previous bit signal to the sampling unit at a third time point in response to the load control signal; a second latch unit suitable for latching the bit signal, as which the sampling unit samples the inverted bit signal corresponding to the inverted signal of the bit signal during a second period, as a first counting bit signal at a second time point in response to a second latch control signal of the plurality of latch control signals; and a third latch unit suitable for latching the bit signal, as which the sampling unit samples the inverted bit signal corresponding to the inverted signal of the previous bit signal during a third period, as a second counting bit signal at a fourth time point in response to a third latch control signal of the plurality of latch control signals.

The counting block may include: a selection unit suitable for selecting any one of the bit signal and the previous bit signal as a selected bit signal in response to the load control signal; and an inversion unit suitable for generating the inverted bit signal by inverting the selected bit signal.

The counting block may further include an offset cancellation unit suitable for performing a digital double sampling (DDS) operation on the bit signal.

The DDS operation may include any one of single-direction counting, up/down counting, and Bit-Wise Inversion (BWI).

The sampling unit may sample the inverted bit signal as the bit signal in response to the counting target clock signal, into which a second reset signal and a second data signal are sequentially reflected during the second period. The offset cancellation unit may perform the DDS operation on the bit signal during the second period. The second latch unit may latch the bit signal on which the DDS operation is performed, as the first counting bit signal.

The sampling unit may sample the inverted bit signal as the bit signal in response to the counting target clock signal, into which a first reset signal is reflected during the first period. The sampling unit may sample the inverted bit signal as the bit signal, on which the DDS operation has been performed regardless of the offset cancellation unit, in response to the counting target clock signal, into which a first data signal is reflected during the third period. The third latch unit may latch the bit signal on which the DDS operation is performed, as the second counting bit signal.

The first period may include the front part of the reset period, the second period may include the rear part of the reset period and the front part of the data period, and the third period may include the rear part of the data period.

In an embodiment, a read-out method of an image sensing device, the read-out method may include: firstly counting a reset signal of a pixel signal based on a first analog gain during a first period of a unit row period; storing a result of the first counting as a previous counting result; secondly counting the reset signal based on a second analog gain; thirdly counting a data signal of the pixel signal based on the second analog gain during a second period following the first period in the unit row period; storing a first counting signal corresponding to results of the second counting and the third counting; fourthly counting the data signal based on the first analog gain during a third period following the second period in the unit row period; and storing a second counting signal corresponding to the previous counting result and a result of the fourth counting.

The third counting may generate the first counting signal through a digital double sampling (DDS) operation.

The fourth counting may generate the second counting signal through the DDS operation.

The DDS operation may include Bit-Wise Inversion (BWI).

The first period may include the front part of the reset period included in the first unit row period, the second period may include the rear part of the reset period and the front part of the data period included in the unit row period, and the third period may include the rear part of the data period.

DETAILED DESCRIPTION

Figure 1:
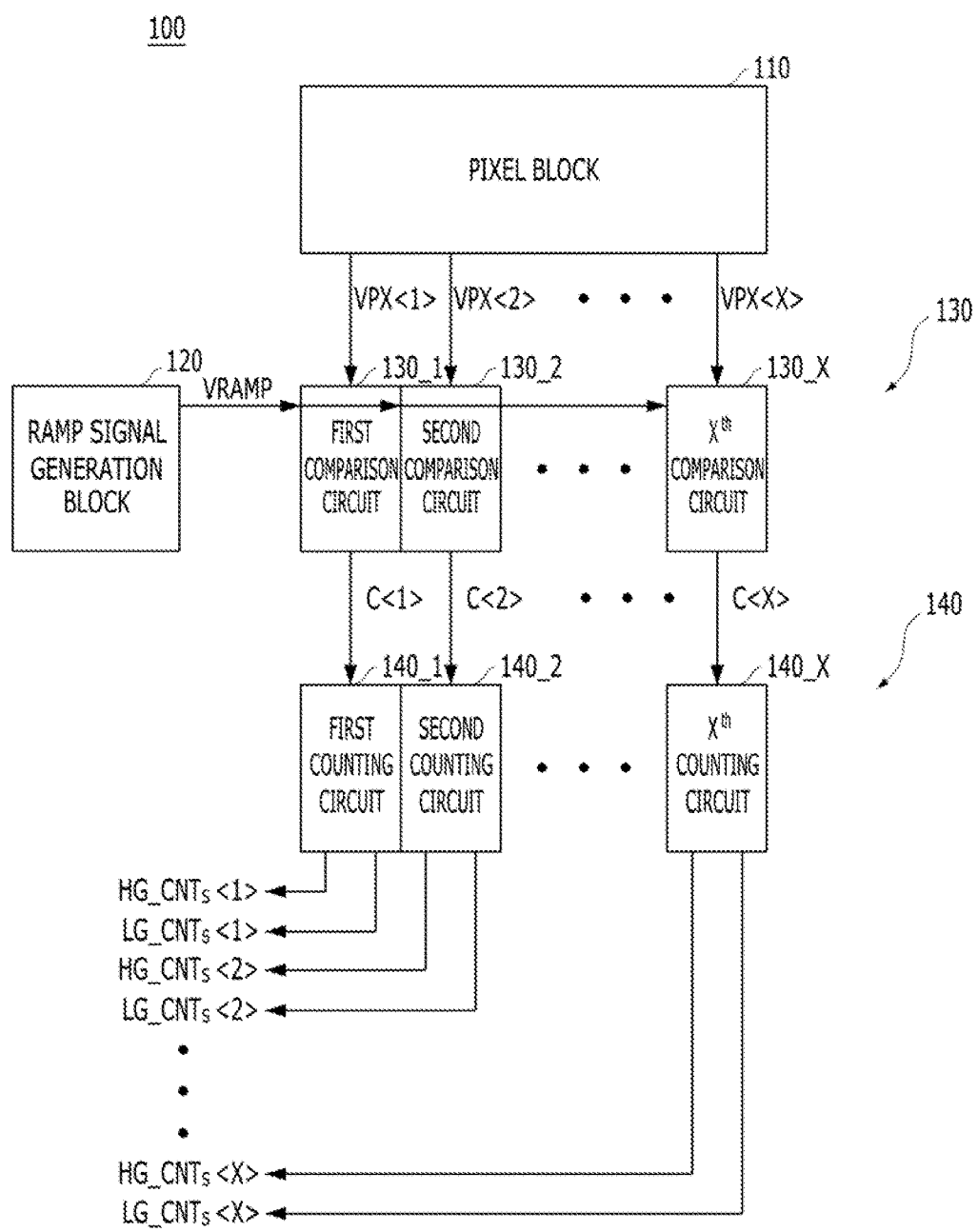
FIG. 1 is a block diagram illustrating an image sensing device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated to clearly illustrate features of the embodiments. It is also noted that in this specification, "connected/coupled" refers to one component not only directly coupling another component, but also indirectly coupling another component through an intermediate component. In addition, a singular form may include a plural form as long as it is not specifically mentioned.

FIG. 1 is a block diagram illustrating an image sensing device in accordance with an embodiment of the present invention.

Referring to FIG. 1, the image sensing device 100 may include a pixel block 110, a ramp signal generation block 120, a comparison block 130, and a counting block 140.

The pixel block 110 may include a plurality of pixels (not illustrated) arranged in the row and column directions. For example, the pixel block 110 may include X*Y pixels. The pixel block 110 may generate a plurality of pixel signals VPX<1:X> for each row. For example, the pixel block 110 may generate the first to Xth pixel signals VPX<1:X> Y times. That is, the pixel block 110 may output the first to Xth pixel signals VPX<1:X> from the X pixels arranged at the first row through first to Xth column lines at the same time during a first unit row time, output the first to Xth pixel signals VPX<1:X> from the X pixels arranged at the second row through the first to Xth column lines at the same time during a second unit row time, and output the first to Xth pixel signals VPX<1:X> from the X pixels arranged at the Yth row through the first to Xth column lines at the same time during a Yth unit row time.

Each of the first to Xth pixel signals VPX<1:X> may include a reset signal and a data signal. In other words, the pixel block 110 may output first to Xth reset signals VRST<1:X> as the first to Xth pixel signals VPX<1:X> during a reset period of the unit row period, and then output first to Xth data signals VSIG<1:X> as the first to Xth pixel signals VPX<1:X> during a data period of the unit row period.

Figure 2:
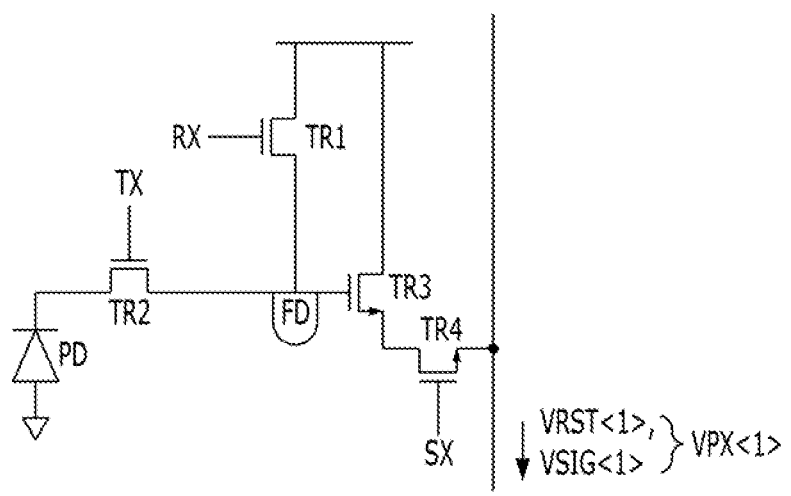
FIG. 2 is a circuit diagram illustrating a pixel included in a pixel block illustrated in FIG. 1.

FIG. 2 is a circuit diagram illustrating a pixel included in the pixel block 110. FIG. 2 illustrates only one of the Y pixels arranged in the first column for convenience of description.

Referring to FIG. 2, the pixel may have a 4-transistor structure. The pixel may include a photodiode PD, a first transistor TR1, a second transistor TR2, a third transistor TR3, and a fourth transistor TR4. The photodiode PD may generate photocharge in response to incident light. The first transistor TR1 may reset a floating diffusion node FD to a predetermined voltage, for example, VDD, in response to a reset signal RX. The second transistor TR2 may transmit the photocharge generated by the photodiode PD to the floating diffusion node FD in response to a transmit signal TX. The third transistor TR3 may transmit the first pixel signal VPX<1> corresponding to the voltage of the floating diffusion node FD to a column line. The fourth transistor TR4 may couple the third transistor TR3 to the column line.

As described above, the first pixel signal VPX<1> may include the first reset signal VRST<1> and the first data signal VSIG<1>. The first reset signal VRST<1> may be generated on the basis of the voltage at which the floating diffusion node FD is reset by the first transistor TR1, and the first data signal VSIG<1> may be generated on the basis of the photocharge which is transmitted to the floating diffusion node FD by the second transistor TR2.

Referring back to FIG. 1, the ramp signal generation block 120 may generate a ramp signal VRAMP which ramps twice at different slopes within a first critical range during the reset period, and ramps twice at different slopes within a second critical range during the data period. The first critical range may include a range of voltage levels which the first to Xth reset signals VRST<1:X> can have, and the second critical range may include a range of voltage levels which the first to Xth data signals VSIG<1:X> can have.

At this time, any one of the slopes at which the ramp signal VRAMP ramps twice during the reset period may be equal to any one of the slopes at which the ramp signal VRAMP ramps twice during the data period, and the other of the slopes at which the ramp signal VRAMP ramps twice during the reset period may be equal to the other of the slopes at which the ramp signal VRAMP ramps twice during the data period. For example, the one slope may correspond to a low gain, and the other slope may correspond to a high gain.

The comparison block 130 may compare the ramp signal VRAMP with the first to Xth pixel signals VPX<1:X>, and generate first to Xth comparison signals C<1:X> corresponding to the comparison results. For example, the comparison block 130 may include first to Xth comparison circuits 130_1 to 130_X respectively corresponding to the first to Xth pixel signals VPX<1:X>. For example, each of the first to Xth comparison circuits 130_1 to 130_X may include an analog to digital converter (ADC). Since the first to Xth comparison circuits 130_1 to 130_X are configured in the same manner, only the comparison circuit 130_1 will be representatively described. The first comparison circuit 130_1 may output a first comparison result, which is obtained by comparing the ramp signal VRAMP to the first reset signal VRST<1>, as the first comparison signal C<1> during the reset period, and output a second comparison result, which is obtained by comparing the ramp signal VRAMP to the first data signal VSIG<1>, as the first comparison signal C<1> during the data period. At this time, since the ramp signal VRAMP ramps twice based on the first reset signal VRST<1> during the reset period, the first comparison result may include comparison results obtained by comparing the ramp signal VRAMP and the first reset signal VRST<1> twice during the reset period. That is, the first comparison result may include a comparison result of the first reset signal VRST<1> based on the low gain and a comparison result of the first reset signal VRST<1> based on the high gain. Hereafter, the comparison result of the first reset signal VRST<1> based on the low gain will be referred to as "low-gain reset comparison result", and the comparison result of the first reset signal VRST<1> based on the high gain will be referred to as "high-gain reset comparison result". Furthermore, since the ramp signal VRAMP ramps twice with reference to the first data signal VSIG<1> during the data period, the second comparison result may include comparison results obtained by comparing the ramp signal VRAMP and the first data signal VSIG<1> twice during the data period. That is, the second comparison result may include a comparison result of the first data signal VSIG<1> based on the low gain and a comparison result of the first data signal VSIG<1> based on the high gain. Hereafter, the comparison result of the first data signal VSIG<1> based on the low gain will be referred to as "low-gain data comparison result", and the comparison result of the first data signal VSIG<1> based on the high gain will be referred to as "high-gain data comparison result".

The counting block 140 may generate first to Xth high-gain counting signals HG_CNTs<1:X> and first to Xth low-gain counting signals LG_CNTs<1:X> in response to the first to Xth comparison signals C<1:X>, a counting clock signal CNT_CLK, first to third latch control signals CtoTL, CtoHGL, and CtoLGL, and a load control signal TLtoC. For example, the counting block 140 may include first to Xth counting circuits 140_1 to 140_X respectively corresponding to the first to Xth comparison signals C<1:X>. Since entire first to Xth counting circuits 140_1 to 140_X are configured in the same manner, only the counting circuit 140_1 will be representatively described. The counting circuit 140_1 will be described with reference to FIG. 3.

Figure 3:
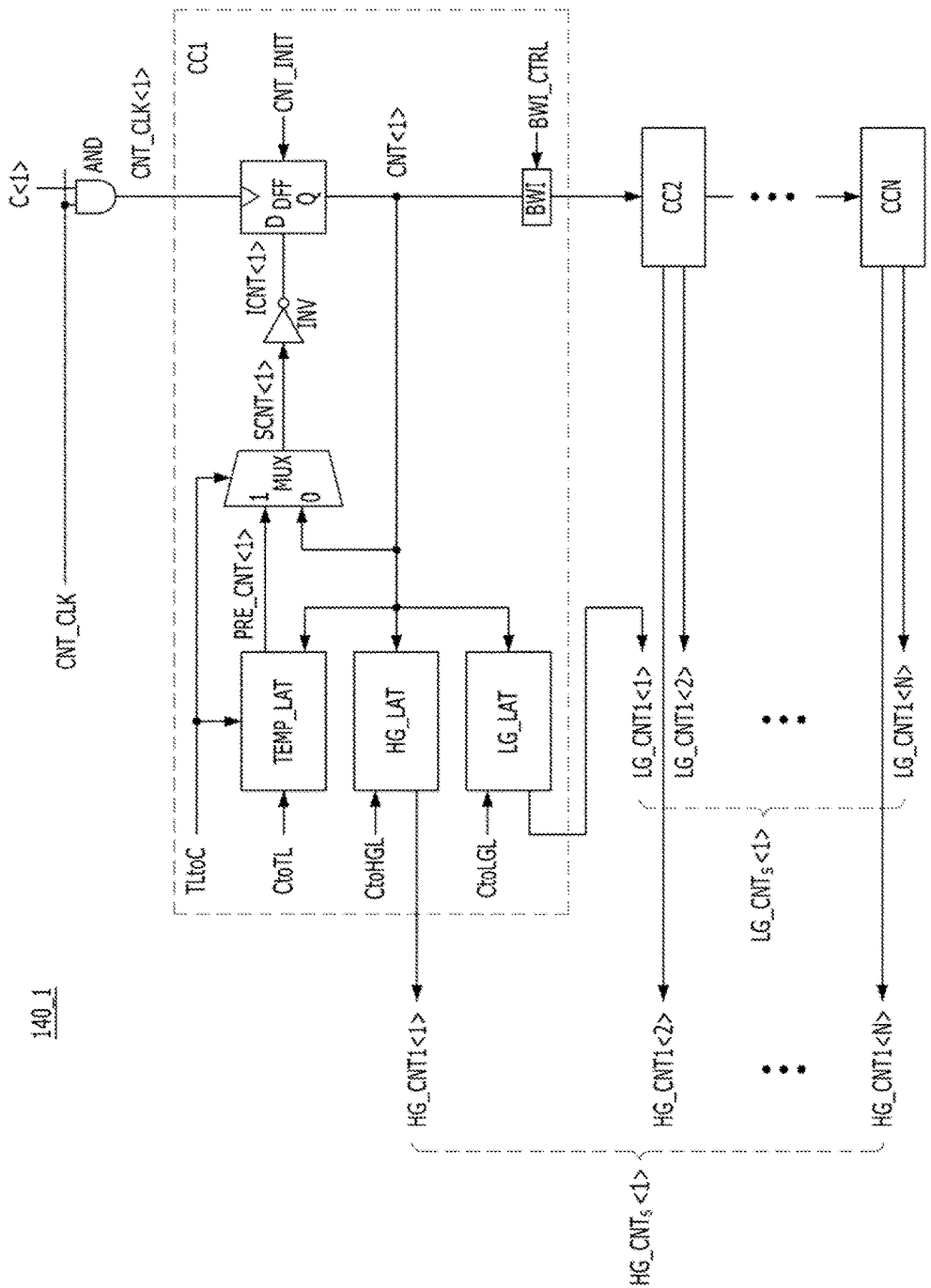
FIG. 3 is a circuit diagram illustrating a first counting circuit illustrated in FIG. 1.

FIG. 3 is a circuit diagram illustrating the first counting circuit 140_1 illustrated in FIG. 1.

Referring to FIG. 3, the first counting circuit 140_1 may include a clock control unit AND and a plurality of counting cells CC1 to CCN.

The clock control unit AND may limit a toggling period of a counting clock signal CNT_CLK based on the first comparison signal C<1>. For example, the clock control unit AND may include an AND gate configured to generate a first counting target clock signal CNT_CLK<1> by performing an AND operation on the counting clock signal CNT_CLK and the first comparison signal C<1>.

The number of the plurality of counting cells CC1 to CCN may correspond to the bit number of a first high-gain counting signal HG_CNTs<1> and a first low-gain counting signal LG_CNTs<1>. For example, the first high-gain counting signal HG_CNTs<1> may include first to Nth high-gain counting bit signals HG_CNT1<1:N>, the first low-gain counting signal LG_CNTs<1> may include first to Nth low-gain counting bit signals LG_CNT1<1:N>, and the first to Nth counting cells CC1 to CCN may correspond to the first to Nth high-gain counting bit signals HG_CNT1<1:N> and the first to Nth low-gain counting bit signals LG_CNT<1:N>. The first to Nth counting cells CC1 to CCN may be coupled in series, and configured to divide a clock signal or divided signal outputted from the counting cell at the previous stage according to a predetermined division ratio. Since all of the first to Nth counting cells CC1 to CCN have the same configuration, only the first counting cell CC1 will be representatively described for convenience of description.

The first counting cell CC1 may include a sampling unit DFF, a first latch unit TEMP_LAT, a second latch unit HG_LAT, a third latch unit LG_LAT, a selection unit MUX, an inversion unit INV, and an offset cancellation unit BWI.

The sampling unit DFF may sample a first inverted bit signal ICNT<1>, which corresponds to any one of an inverted signal of the first bit signal CNT<1> and an inverted signal of the first previous bit signal PRE_CNT<1>, as the first bit signal CNT<1> in response to the first counting target clock signal CNT_CLK<1>. In response to a counting initialization signal CNT_INIT, the sampling unit DFF may be initialized twice at the periods in which the ramp signal VRAMP ramps twice during the reset period. For example, the sampling unit DFF may include a D flip-flop.

The first latch unit TEMP_LAT may latch the first bit signal CNT<1>, which is sampled during a first period on the basis of the first inverted bit signal ICNT<1> corresponding to the inverted signal of the first bit signal CNT<1>, as a first previous bit signal PRE_CNT<1> at a first time point in response to the first latch control signal CtoTL. The first period may include the front part of the reset period. The first previous bit signal PRE_CNT<1> may correspond to the least significant bit (LSB) of the first previous counting signal PRE_CNT<1:N> into which the low-gain reset comparison result is reflected. The first latch unit TEMP_LAT may provide the first previous bit signal PRE_CNT<1> to the selection unit MUX at a third time point in response to the load control signal TLtoC.

The second latch unit HG_LAT may latch the first bit signal CNT<1>, which is sampled during a second period on the basis of the first inverted bit signal ICNT<1> corresponding to the inverted signal of the first bit signal CNT<1>, as a first high-gain counting bit signal HG_CNT1<1> at a second time point in response to the second latch control signal CtoHGL. The second period may include the rear part of the reset period and the front part of the data period. The first high-gain counting bit signal HG_CNT1<1> may correspond to the LSB of the first high-gain counting signal HG_CNTs<1> into which the high-gain reset comparison result and the high-gain data comparison result are reflected.

The third latch unit LG_LAT may latch the first bit signal CNT<1>, which is sampled during a third period on the basis of the first inverted bit signal ICNT<1> corresponding to the inverted signal of the first previous bit signal PRE_CNT<1>, as the first low-gain counting bit signal LG_CNT1<1> at a fourth time point in response to the third latch control signal CtoLGL. The third period may include the rear part of the data period. The first low-gain counting bit signal LG_CNT1<1> may correspond to the LSB of the first low-gain counting signal LG_CNTs<1> into which the low-gain reset comparison result and the low-gain data comparison result are reflected.

The selection unit MUX may select any one of the first bit signal CNT<1> and the first previous bit signal PRE_CNT<1> as the first selected bit signal SCNT<1> in response to the load control signal TLtoC. For example, the selection unit MUX may include a multiplexer.

The inversion unit INV may generate the first inverted bit signal ICNT<1> by inverting the first selected bit signal SCNT<1>. For example, the inversion unit INV may include an inverter.

The offset cancellation unit BWI may be coupled to an output node of the sampling unit DFF, at which the first bit signal CNT<1> is outputted, and perform the digital double sampling (DDS) operation. The DDS may cancel an offset, that is, an ADC offset caused by the first comparison circuit 130_1. The DDS operation may include single-direction counting, up/down counting, bit-wise inversion (BWI) and the like. In the present embodiment, the BWI will be taken as an example for describing the DDS operation. For example, the offset cancellation unit BWI may take complement of one (1) by inverting the first bit signal CNT<1> corresponding to the high-gain reset comparison result, and then reflect a result of the complement of one (1) on the first bit signal CNT<1> corresponding to the high-gain data comparison result. The first bit signal CNT<1> generated in such a manner may include a result obtained by subtracting the first reset signal VRST<1> from the first data signal VSIG<1>.

Figure 4:
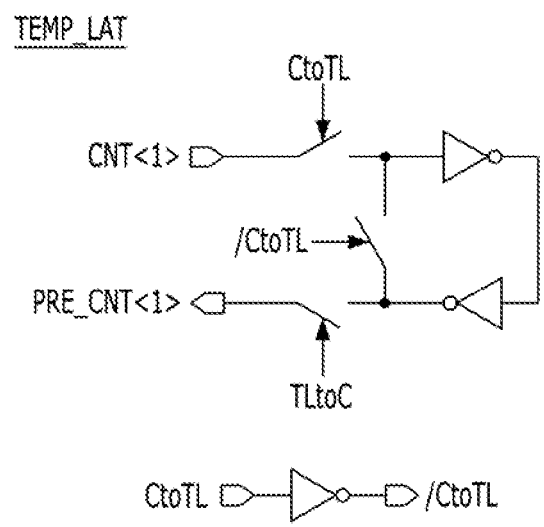
FIG. 4 is a circuit diagram illustrating a first latch unit illustrated in FIG. 3.

FIG. 4 is a circuit diagram illustrating the first latch unit TEMP_LAT illustrated in FIG. 3.

Referring to FIG. 4, the first latch unit TEMP_LAT may latch the first bit signal CNT<1> in response to the first latch control signal CtoTL, and output the first previous bit signal PRE_CNT<1> in response to the load control signal TLtoC.

Figure 5:
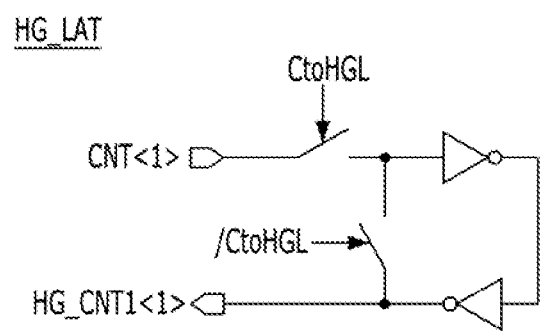
FIG. 5 is a circuit diagram illustrating a second latch unit illustrated in FIG. 3.
Figure 5:
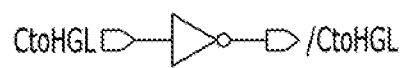

FIG. 5 is a circuit diagram illustrating the second latch unit HG_LAT illustrated in FIG. 3.

Referring to FIG. 5, the second latch unit HG_LAT may latch and output the first bit signal CNT<1> as the first high-gain counting bit signal HG_CNT1<1> in response to the second latch control signal CtoHGL.

Figure 6:
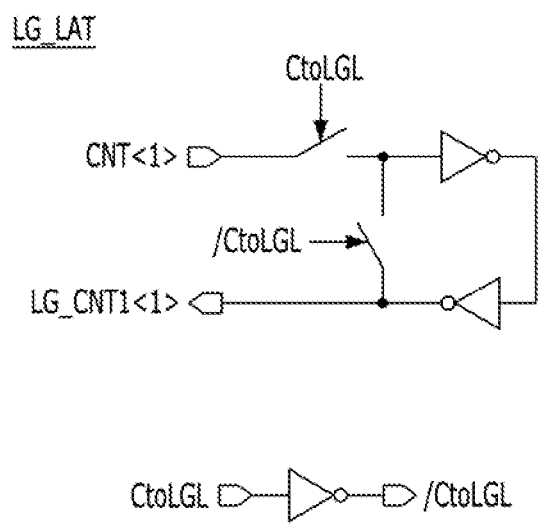
FIG. 6 is a circuit diagram illustrating a third latch unit illustrated in FIG. 3.

FIG. 6 is a circuit diagram illustrating the third latch unit LG_LAT illustrated in FIG. 3.

Referring to FIG. 6, the third latch unit LG_LAT may latch and output the first bit signal CNT<1> as the first low-gain counting bit signal LG_CNT1<1> in response to the third latch control signal CtoLGL.

The operation of the image sensing device 100 having the above-described configuration will be described with reference to FIG. 7.

Figure 7:
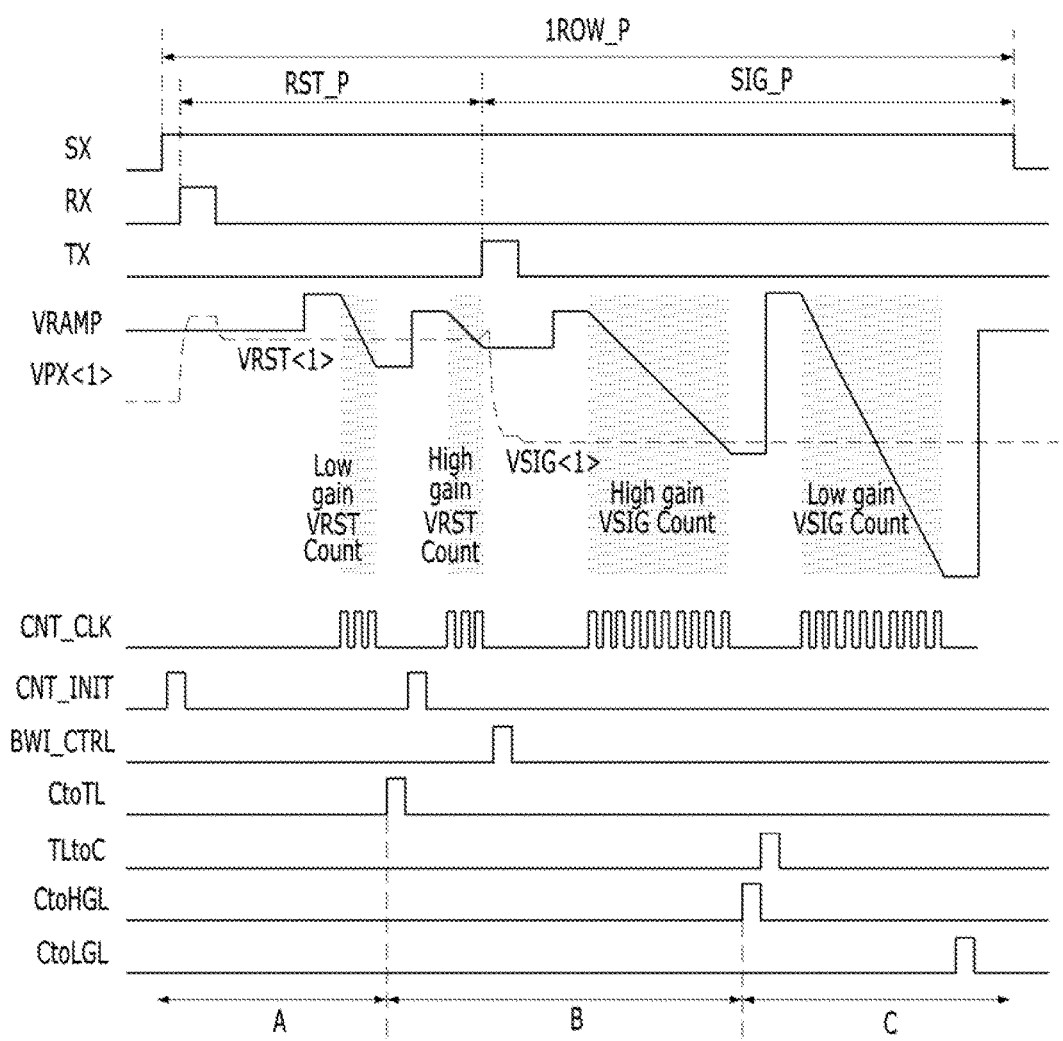
FIG. 7 is a timing diagram illustrating a read-out method of the image sensing device in accordance with the embodiment of the present invention.

FIG. 7 is a timing diagram illustrating a read-out method of the image sensing device 100 in accordance with the embodiment of the present invention.

FIG. 7 representatively shows only the first pixel signal VPX<1> which is read out during a first row line period 1ROW_P.

Referring to FIG. 7, the read-out method of the image sensing device 100 may include: firstly counting the first reset signal VRST<1> of the first pixel signal VPX<1> based on the low gain during a first period A of the first unit row period 1ROW_P; storing a result of the first counting as a previous counting result; secondly counting the first reset signal VRST<1> of the first pixel signal VPX<1> based on the high gain, and thirdly counting the first data signal VSIG<1> of the first pixel signal VPX<1> based on the high gain, during a second period B following the first period A in the first unit row period 1ROW_P; storing the first high-gain counting signal HG_CNT1<1> corresponding to results of the second counting and the third counting; fourthly counting the first data signal VSIG<1> of the first pixel signal VPX<1> based on the low gain during a third period C following the second period B in the first unit row period 1ROW_P; and storing the first low-gain counting signal LG_CNT1<1> corresponding to the previous counting result and a result of the fourth counting.

The first period A may include the front part of the reset period included in the first unit row period 1ROW_P, the second period B may include the rear part of the reset period RST_P and the front part of the data period SIG_P included in the first unit row period 1ROW_P, and the third period C may include the rear part of the data period SIG_P.

The first counting of the first reset signal VRST<1> of the first pixel signal VPX<i> will be described in more detail as follows.

The pixel block 110 may generate the reset signal VRST<1> as the first pixel signal VPX<1> in response to the reset signal RX. The ramp signal generation block 120 may generate a ramp signal VRAMP which ramps at a slope corresponding to the low gain within the first critical range. Then, the first comparison circuit 130_1 may compare the ramp signal VRAMP and the first reset signal VRST<1>, and generate the first comparison signal C<1> corresponding to a result of the comparison. Then, the first counting circuit 140_1 may generate the first to Nth bit signals CNT<1:N> corresponding to the result of the first counting in response to the first comparison signal C<1> and the counting clock signal CNT_CLK.

The operation of the first counting circuit 140_1 will be described in more detail as follows.

The operation of the first counting cell CC1 included in the first counting circuit 140_1 will be representatively described. The sampling unit DFF may be initialized in response to the counting initialization signal CNT_INT before or when the reset period RST_P begins. The sampling unit DFF may generate the first bit signal CNT<1> based on the first counting target clock signal CNT_CLK<1> and the first inverted bit signal ICNT<1>, into which the first reset signal VRST<1> is reflected, during the first period A. The first counting target clock signal CNT_CLK<1> may be obtained by performing an AND operation on the first comparison signal C<1> and the counting clock signal CNT_CLK. In other words, the sampling unit DFF may sample the first inverted bit signal ICLK<1> as the first bit signal CNT<1> during the first period A based on the first counting target clock signal CNT_CLK<1>. At this time, the low-gain reset comparison result may be reflected into the sampled first bit signal CNT<1>.

The storing of the first counting result as the previous counting result will be described in more detail as follows.

The first counting circuit 140_1 may temporarily store the first to Nth bit signals CNT<1:N> as the first previous counting signal PRE_CNT<1:N> in response to the first latch control signal CtoTL which pulses at the first time point when the first period A ends. At this time, the operation of the first counting cell CC1 included in the first counting circuit 140_1 will be representatively described. The first latch unit TEMP_LAT may latch the first bit signal CNT<1> as the first previous bit signal PRE_CNT<1> in response to the first latch control signal CtoTL. The first previous bit signal PRE_CNT<1> may correspond to the LSB of the first previous counting signal PRE_CNT<1:N>.

The second counting of the first reset signal VRST<1> of the first pixel signal VPX<1>, and the third counting of the first data signal VSIG<1> of the first pixel signal VPX<1> will be described in more detail as follows.

The pixel block 110 may generate the first reset signal VRST<1> as the first pixel signal VPX<1> in response to the reset signal RX during the reset period RST_P, and generate the first data signal VSIG<1> as the first pixel signal VPX<1> in response to the transmit signal TX during the data period SIG_P. The ramp signal generation block 120 may generate the ramp signal VRAMP which ramps at a slope corresponding to the high gain within the first critical range during a period corresponding to the rear part of the reset period RST_P in the second period B, and then generate the ramp signal VRAMP which ramps at a slope corresponding to the high gain within the second critical range during a period corresponding to the front part of the data period SIG_P in the second period B. Then, the first comparison circuit 130_1 may compare the ramp signal VRAMP and the first reset signal VRST<1>, and generate the first comparison signal C<1> corresponding to a result of the comparison during the second period B. At this time, the first comparison signal C<1> may include the high-gain reset comparison result and the high-gain data comparison result. Then, the first counting circuit 140_1 may generate the first to Nth bit signals CNT<1:N> corresponding to the second counting result and the third counting result in response to the first comparison signal C<1> and the counting clock signal CNT_CLK. At this time, the counting circuit 140_1 may generate the first to Nth bit signals CNT<1:N> through the DDS operation.

The operation of the first counting circuit 140_1 will be described in more detail as follows.

The operation of the first counting cell CC1 included in the first counting circuit 140_1 will be representatively described. The sampling unit DFF may be initialized in response to the counting initialization signal CNT_INIT at an initial stage of the second period B. For example, the sampling unit DFF may be initialized after the first previous bit signal PRE_CNT<1> is latched. Then, the sampling unit DFF may sample the first inverted bit signal ICNT<1> as the first bit signal CNT<1> based on the first counting target clock signal CNT_CLK<1>, into which the first reset signal VRST<1> is reflected, during a period corresponding to the rear part of the reset period RST_P in the second period B. At this time, the high-gain reset comparison result may be reflected into the first bit signal CNT<1>. For the DDS operation, the offset cancellation unit BWI may take the complement of one (1) for the first bit signal CNT<1>. For example, the offset cancellation unit BWI may invert the first bit signal CNT<1>. Then, the sampling unit DFF may sample the first inverted bit signal ICNT<1> as the first bit signal CNT<1> based on the first counting target clock signal CNT_CLK<1>, into which the first data signal VSIG<1> is reflected, during a period corresponding to the front part of the data period SIG_P in the second period B. At this time, the high-gain reset comparison result and the high-gain data comparison result may be reflected into the first bit signal CNT<1>. That is, the first bit signal CNT<1> may include a result obtained by subtracting the first reset signal VRST<1> from the first data signal VSIG<1> based on the DDS operation.

The storing of the first high-gain counting signal HG_CNT1<1> corresponding to the second counting result and the third counting result will be described in more detail as follows.

The first counting circuit 140_1 may temporarily store the first to Nth bit signals CNT<1:N> as the first high-gain counting signal HG_CNTs<1> in response to the second latch control signal CtoHGL which pulses at the second time point when the second period B ends. At this time, the operation of the first counting cell CC1 included in the first counting circuit 140_1 will be representatively described. The second latch unit HG_LAT may latch the first bit signal CNT<1> as the first high-gain counting bit signal HG_CNT1<1> at the second time point. The first high-gain counting bit signal HG_CNT1<1> may correspond to the LSB of the first high-gain counting signal HG_CNTs<1>.

The fourth counting of the first data signal VSIG<1> will be described in more detail as follows.

The first counting circuit 140_1 may load the temporarily-stored first previous counting signal PRE_CNT<1:N> in response to the load control signal TLtoC at an initial stage of the third period C. At this time, the operation of the first counting cell CC1 included in the first counting circuit 140_1 will be representatively described. The first latch unit TEMP_LAT may output the first previous bit signal PRE_CNT<1> in response to the load control signal TLtoC, the selection unit MUX may output the first previous bit signal PRE_CNT<1> as the first selected bit signal SCNT<1> in response to the load control signal TLtoC, and the inversion unit INV may invert the first selected bit signal SCNT<1> and output the first inverted bit signal ICNT<1>. In such a state, the ramp signal generation block 120 may generate the ramp signal VRAMP which ramps at a slope corresponding to the high gain within the second critical range during the third period C. The first comparison circuit 130_1 may compare the ramp signal VRAMP and the first data signal VSIG<1>, and generate the first comparison signal C<1> corresponding to a result of the comparison. At this time, the low-gain data comparison result may be reflected into the first comparison signal C<1>. Then, the first counting circuit 140_1 may generate the first to Nth bit signals CNT<1:N> corresponding to the previous counting result and the fourth counting result in response to the first comparison signal C<1> and the counting clock signal CNT_CLK. At this time, the counting circuit 140_1 may generate the first to Nth bit signals CNT<1:N> through the DDS operation.

At this time, the operation of the first counting cell CC1 included in the first counting circuit 140_1 will be representatively described as follows. The sampling unit DFF may sample the first inverted bit signal ICNT<1> corresponding to the first previous bit signal PRE_CNT<1> as the first bit signal CNT<1> based on the first counting target clock CNT_CLK<1>, into which the first data signal VSIG<1> is reflected, during the third period C. At this time, the low-gain reset comparison result and the low-gain data comparison result may be reflected into the first bit signal CNT<1>. This is because the complement of one (1) can be automatically taken while the first previous bit signal PRE_CNT<1> passes through the inversion unit INV regardless of the offset cancellation unit BWI. Thus, the first bit signal CNT<i> may include a result obtained by subtracting the first reset signal VRST<1> from the first data signal VSIG<1> based on the DDS operation.

The storing of the first low-gain counting signal LG_CNT1<1> corresponding to the previous counting result and the fourth counting result will be described in more detail as follows.

The first counting circuit 140_1 may store the first to Nth bit signals CNT<1:N> as the first low-gain counting signal LG_CNTs<1> in response to the third latch control signal CtoLGL which pulses at the third time point when the third period C ends. At this time, the operation of the first counting cell CC1 included in the first counting circuit 140_1 will be representatively described. The third latch unit LG_LAT may latch the first bit signal CNT<1> as the low-gain counting bit signal LG_CNT1<1> at the third time point. The first low-gain counting bit signal LG_CNT1<1> may correspond to the LSB of the first low-gain counting signal LG_CNTs<1>.

In accordance with the embodiments of the present invention, the image sensing device can perform the DDS operation for each gain in order of the reset signal and the data signal, and thus acquire image data from which KT/C noise is removed.

In other words, since the image sensing device can perform two or more read-out operations for the same pixel through CDS during the unit row period, the image sensing device can acquire clear image data from which KT/C noise is removed.

Furthermore, since two or more read-out operations can be performed, the dynamic range can be easily expanded.

Although various embodiments have been described for illustrative purposes, it will be apparent to those skilled in the art that various changes and modifications may be made without departing from the spirit and scope of the invention as defined in the following claims.

For example, the case in which two image data (counting signals) corresponding to two gains (low gain and high gain) are acquired has been taken as an example for describing the embodiments. However, the present invention is not limited thereto, but three or more image data corresponding to third or more gains can be acquired.

What is claimed is:

1. A counting circuit comprising:
a sampling circuit configured to sample an inverted bit signal, which corresponds to any one of inverted signals of a bit signal and a previous bit signal, as the bit signal in response to a counting target clock signal;
a first latch circuit configured to latch the bit signal, as which the sampling circuit samples the inverted bit signal corresponding to the inverted signal of the bit signal during a first period, as the previous bit signal at a first time point in response to a first latch control signal, and provide the previous bit signal to the sampling circuit at a third time point in response to a load control signal;
a second latch circuit configured to latch the bit signal, as which the sampling circuit samples the inverted bit signal corresponding to the inverted signal of the bit signal during a second period, as a first counting bit signal at a second time point in response to a second latch control signal; and a third latch circuit configured to latch the bit signal, as which the sampling circuit samples the inverted bit signal corresponding to the inverted signal of the previous bit signal during a third period, as a second counting bit signal at a fourth time point in response to a third latch control signal.

2. The counting circuit of claim 1, further comprising:
a selection circuit configured to select any one of the bit signal and the previous bit signal as a selected bit signal in response to the load control signal; and
an inversion circuit configured to generate the inverted bit signal by inverting the selected bit signal.

3. The counting circuit of claim 1, further comprising an offset cancellation circuit configured to perform a digital double sampling (DDS) operation on the bit signal.

4. The counting circuit of claim 3, wherein the DDS operation comprises any one of single-direction counting, up/down counting, and Bit-Wise Inversion (BWI).

5. The counting circuit of claim 3,
wherein the sampling circuit samples the inverted bit signal as the bit signal in response to the counting target clock signal, into which a second reset signal and a second data signal are sequentially reflected during the second period,
wherein the offset cancellation circuit performs the DDS operation on the bit signal during the second period, and
wherein the second latch circuit latches the bit signal, on which the DDS operation is performed, as the first counting bit signal.

6. The counting circuit of claim 5,
wherein the sampling circuit samples the inverted bit signal as the bit signal in response to the counting target clock signal, into which a first reset signal is reflected during the first period,
wherein the sampling circuit samples the inverted bit signal as the bit signal, on which the DDS operation has been performed regardless of the offset cancellation circuit, in response to the counting target clock signal, into which a first data signal is reflected during the third period, and
wherein the third latch circuit latches the bit signal, on which the DDS operation is performed, as the second counting bit signal.

7. An image sensing device comprising:
a pixel circuit configured to generate a pixel signal corresponding to a reset signal during a single reset period of a unit row period, and generate the pixel signal corresponding to a data signal during a single data period of the unit row period;
a ramp signal generation circuit configured to generate a single ramp signal which ramps a plurality of times with different slopes during the single reset period and ramps a plurality of times with different slopes during the single data period;
a comparison circuit configured to generate a comparison signal which includes a first comparison result obtained by comparing the single ramp signal and the reset signal a plurality of times during the reset signal, and a second comparison result obtained by comparing the single ramp signal and the data signal a plurality of times during the single data period; and
a counting circuit configured to generate a plurality of counting signals corresponding to the first and second comparison results in response to a counting clock signal, a plurality of latch control signals, one or more load control signals, and the comparison signal during the unit row period.

8. The image sensing device of claim 7, wherein the counting circuit generates the plurality of counting signals through correlated double sampling (CDS).

9. The image sensing device of claim 7, wherein the counting circuit comprises:
a counting control circuit configured to generate a counting target clock signal in response to the counting clock signal and the comparison signal;
a sampling circuit configured to sample an inverted bit signal, which corresponds to any one of inverted signals of a bit signal and a previous bit signal, as the bit signal in response to the counting target clock signal;
a first latch circuit configured to latch the bit signal, as which the sampling circuit samples the inverted bit signal corresponding to the inverted signal of the bit signal during a first period, as the previous bit signal at a first time point in response to a first latch control signal of the plurality of latch control signals, and provide the previous bit signal to the sampling circuit at a third time point in response to the load control signal;
a second latch circuit configured to latch the bit signal, as which the sampling circuit samples the inverted bit signal corresponding to the inverted signal of the bit signal during a second period, as a first counting bit signal at a second time point in response to a second latch control signal of the plurality of latch control signals; and
a third latch circuit configured to latch the bit signal, as which the sampling circuit samples the inverted bit signal corresponding to the inverted signal of the previous bit signal during a third period, as a second counting bit signal at a fourth time point in response to a third latch control signal of the plurality of latch control signals.

10. The image sensing device of claim 9, wherein the counting circuit further comprises:
a selection circuit configured to select any one of the bit signal and the previous bit signal as a selected bit signal in response to the load control signal; and
an inversion circuit configured to generate the inverted bit signal by inverting the selected bit signal.

11. The image sensing device of claim 9, wherein the counting circuit further comprises an offset cancellation circuit configured to perform a digital double sampling (DDS) operation on the bit signal.

12. The image sensing device of claim 11, wherein the DDS operation comprises any one of single-direction counting, up/down counting, and Bit-Wise Inversion (BWI).

13. The image sensing device of claim 11,
wherein the sampling circuit samples the inverted bit signal as the bit signal in response to the counting target clock signal, into which a second reset signal and a second data signal are sequentially reflected during the second period,
wherein the offset cancellation circuit performs the DDS operation on the bit signal during the second period, and
wherein the second latch circuit latches the bit signal on which the DDS operation is performed, as the first counting bit signal.

14. The image sensing device of claim 13,
wherein the sampling circuit samples the inverted bit signal as the bit signal in response to the counting target clock signal, into which a first reset signal is reflected during the first period,
wherein the sampling circuit samples the inverted bit signal as the bit signal, on which the DDS operation has been performed regardless of the offset cancellation circuit, in response to the counting target clock signal, into which a first data signal is reflected during the third period, and
wherein the third latch circuit latches the bit signal on which the DDS operation is performed, as the second counting bit signal.

15. The image sensing device of claim 9,
wherein the first period comprises the front part of the single reset period,
wherein the second period comprises the rear part of the single reset period and the front part of the single data period, and
wherein the third period comprises the rear part of the single data period.

\* \* \* \* \*